(12) United States Patent
Goto et al.

(10) Patent No.: US 10,985,016 B2
(45) Date of Patent: Apr. 20, 2021

(54) SEMICONDUCTOR SUBSTRATE, AND EPITAXIAL WAFER AND METHOD FOR PRODUCING SAME

(71) Applicants: TAMURA CORPORATION, Tokyo (JP); National Unversity Corporation Tokyo University of Agriculture and Technology, Tokyo (JP)

(72) Inventors: Ken Goto, Tokyo (JP); Yoshinao Kumagai, Tokyo (JP); Hisashi Murakami, Tokyo (JP)

(73) Assignees: Tamura Corporation, Tokyo (JP); National University Corporation Tokyo University of Agriculture and Technology, Tokyo (JP)

( * ) Notice: Subject to any disclaimer, the term of this patent is extended or adjusted under 35 U.S.C. 154(b) by 374 days.

(21) Appl. No.: 16/061,486

(22) PCT Filed: Nov. 16, 2016

(86) PCT No.: PCT/JP2016/083986
§ 371 (c)(1),
(2) Date: Jun. 12, 2018

(87) PCT Pub. No.: WO2017/104341
PCT Pub. Date: Jun. 22, 2017

(65) Prior Publication Data
US 2020/0243332 A1 Jul. 30, 2020

(30) Foreign Application Priority Data
Dec. 16, 2015 (JP) .............................. JP2015-245570

(51) Int. Cl.
*H01L 21/02* (2006.01)
*C30B 25/16* (2006.01)
(Continued)

(52) U.S. Cl.
CPC ........ *H01L 21/02293* (2013.01); *C30B 25/16* (2013.01); *C30B 25/20* (2013.01);
(Continued)

(58) Field of Classification Search
CPC ......... H01L 21/02293; H01L 21/02609; H01L 21/02631; C30B 25/16; C30B 25/20; C30B 29/16; C30B 25/205
See application file for complete search history.

(56) References Cited

U.S. PATENT DOCUMENTS 9,716,004 B2    7/2017   Sasaki
2008/0283846 A1*   11/2008   Ohmae ................. H01L 33/007
                                                            257/79
(Continued)

FOREIGN PATENT DOCUMENTS

EP    2 754 736 A1    7/2014
EP    2 924 150 A1    9/2015
(Continued)

OTHER PUBLICATIONS

International Preliminary Report on Patentability and Written Opinion dated Jun. 28, 2018 issued in PCT/JP2016/083986.
(Continued)

*Primary Examiner* — Mohammed R Alam
(74) *Attorney, Agent, or Firm* — Scully, Scott, Murphy & Presser, PC

(57) ABSTRACT

A semiconductor substrate that is used as an underlying substrate for epitaxial crystal growth carried out by the HVPE method includes a $\beta$-$Ga_2O_3$-based single crystal, and a principal plane that is a plane parallel to a [100] axis of the $\beta$-$Ga_2O_3$-based single crystal. An epitaxial wafer includes the semiconductor substrate, and an epitaxial layer including a $\beta$-$Ga_2O_3$-based single crystal and formed on the principal plane of the semiconductor substrate by epitaxial crystal growth using the HVPE method. A method for producing an epitaxial wafer includes by using the HVPE method, epitaxially growing an epitaxial layer including a $\beta$-$Ga_2O_3$-based single crystal on a semiconductor substrate that
(Continued)

includes a β-Ga$_2$O$_3$-based single crystal and has a principal plane parallel to a [100] axis of the β-Ga$_2$O$_3$-based single crystal.

9 Claims, 15 Drawing Sheets

(51) Int. Cl.
  *C30B 25/20* (2006.01)
  *C30B 29/16* (2006.01)
(52) U.S. Cl.
  CPC ........ *C30B 29/16* (2013.01); *H01L 21/02609* (2013.01); *H01L 21/02631* (2013.01)

(56) References Cited

U.S. PATENT DOCUMENTS

| | | | |
|---|---|---|---|
| 2014/0217554 A1 | 8/2014 | Sasaki | |
| 2014/0239452 A1* | 8/2014 | Sasaki | H01L 29/045 257/613 |
| 2014/0332823 A1* | 11/2014 | Takizawa | H01L 29/267 257/76 |
| 2015/0249185 A1 | 9/2015 | Koshi et al. | |
| 2016/0265137 A1 | 9/2016 | Goto et al. | |
| 2017/0145590 A1 | 5/2017 | Goto et al. | |

FOREIGN PATENT DOCUMENTS

| | | |
|---|---|---|
| JP | 2015-91740 A | 5/2015 |
| JP | 2015-214448 A | 12/2015 |
| WO | WO 2013/035464 A1 | 3/2013 |
| WO | 2015/046006 A1 | 4/2015 |
| WO | 2015/170774 A1 | 11/2015 |

OTHER PUBLICATIONS

Extended Supplementary European Search Report dated Jun. 21, 2019 in European Patent Application No. 16 87 5325.9.
International Search Report dated Dec. 20, 2016 issued in PCT/JP2016/083986.

* cited by examiner

SEMICONDUCTOR SUBSTRATE, AND EPITAXIAL WAFER AND METHOD FOR PRODUCING SAME

TECHNICAL FIELD

The invention relates to a semiconductor substrate, and an epitaxial wafer and a method for manufacturing the same.

BACKGROUND ART

A technique of forming a β-$Ga_2O_3$ single crystal film on a β-$Ga_2O_3$-based substrate by epitaxial crystal growth using the MBE (Molecular Beam Epitaxy) method is conventionally known (see, e.g., WO 2013/035464).

According to WO 2013/035464, the β-$Ga_2O_3$ single crystal film can be grown at a high growth rate by the MBE method when the plane orientation of the principal plane of the β-$Ga_2O_3$-based substrate is adjusted to a predetermined plane orientation.

CITATION LIST

Patent Literatures

WO 2013/035464

SUMMARY OF INVENTION

Technical Problem

It is an object of the invention to provide a semiconductor substrate comprising a β-$Ga_2O_3$-based single crystal on which an epitaxial layer comprising a β-$Ga_2O_3$-based single crystal can be grown by the HVPE method at a high growth rate; an epitaxial wafer having the semiconductor substrate and an epitaxial layer; and a method for producing the epitaxial wafer.

It is another object of the invention to provide a semiconductor substrate comprising a β-$Ga_2O_3$-based single crystal on which an epitaxial layer comprising a β-$Ga_2O_3$-based single crystal having good surface morphology can be grown by the HVPE method; an epitaxial wafer having the semiconductor substrate and an epitaxial layer; and a method for producing the epitaxial wafer.

Solution to Problem

To achieve the above-mentioned objects, an aspect of the invention provides a semiconductor substrate described in [1] to [7] below, an epitaxial wafer described in [8], or a method for producing an epitaxial wafer described in [9] to [16].

[1] A semiconductor substrate that is used as an underlying substrate for epitaxial crystal growth carried out by the HVPE method, the semiconductor substrate comprising: a β-$Ga_2O_3$-based single crystal; and a principal plane that is a plane parallel to a [100] axis of the β-$Ga_2O_3$-based single crystal.

[2] The semiconductor substrate described in [1], wherein an angle θ formed between the principal plane and a (001) plane of the β-$Ga_2O_3$-based single crystal is not less than 30° and not more than 90°, or not less than −150° and not more than −90°, where an angle generated by rotation in a rotation direction of a right-handed screw advancing in the a-axis direction is defined as a positive angle.

[3] The semiconductor substrate described in [2], wherein the semiconductor substrate has an average dislocation density of not more than $1\times10^4/cm^2$, and the angle θ is not less than 54.3° and not more than 65.7°, or not less than −125.7° and not more than −114.3°.

[4] The semiconductor substrate described in [2], wherein the semiconductor substrate has an average dislocation density of not more than $1\times10^3/cm^2$, and the angle θ is not less than 41.6° and not more than 78.4°, or not less than −138.4° and not more than −101.6°.

[5] The semiconductor substrate described in [1], wherein an angle θ formed between the principal plane and the (001) plane of the β-$Ga_2O_3$-based single crystal is not less than −0.33° and not more than 0.33°, more than 45° and not more than 90°, or less than −45° and not less than −90°, where an angle generated by rotation in a rotation direction of a right-handed screw advancing in the a-axis direction is defined as a positive angle.

[6] The semiconductor substrate described in [1], wherein an angle θ formed between the principal plane and the (001) plane of the β-$Ga_2O_3$-based single crystal is not less than −30° and not more than 30°, where an angle generated by rotation in a rotation direction of a right-handed screw advancing in the a-axis direction is defined as a positive angle.

[7] The semiconductor substrate described in [6], wherein the angle θ is not less than 0.3° and not more than 15°, or not less than −15° and not more than −0.3°.

[8] An epitaxial wafer, comprising: the semiconductor substrate described in any one of [1] to [7]; and an epitaxial layer comprising a β-$Ga_2O_3$-based single crystal and formed on the principal plane of the semiconductor substrate by epitaxial crystal growth using the HVPE method.

[9] A method for producing an epitaxial wafer, comprising: by using the HVPE method, epitaxially growing an epitaxial layer comprising a β-$Ga_2O_3$-based single crystal on a semiconductor substrate that comprises a β-$Ga_2O_3$-based single crystal and has a principal plane parallel to a [100] axis of the β-$Ga_2O_3$-based single crystal.

[10] The method for producing an epitaxial wafer described in [9], wherein an angle θ formed between the principal plane and a (001) plane of the β-$Ga_2O_3$-based single crystal is not less than 30° and not more than 90°, or not less than −150° and not more than −90°, where an angle generated by rotation in a rotation direction of a right-handed screw advancing in the a-axis direction is defined as a positive angle.

[11] The method for producing an epitaxial wafer described in [10], wherein the semiconductor substrate has an average dislocation density of not more than $1\times10^4/cm^2$, and the angle θ is not less than 54.3° and not more than 65.7°, or not less than −125.7° and not more than −114.3°.

[12] The method for producing an epitaxial wafer described in [10], wherein the semiconductor substrate has an average dislocation density of not more than $1\times10^3/cm^2$, and the angle θ is not less than 41.6° and not more than 78.4°, or not less than −138.4° and not more than −101.6°.

[13] The method for producing an epitaxial wafer described in [9], wherein an angle θ formed between the principal plane and the (001) plane of the β-$Ga_2O_3$-based single crystal is not less than −0.33° and not more than 0.33°, more than 45° and not more than 90°, or less than −45° and not less than −90°, where an angle generated by rotation in a rotation direction of a right-handed screw advancing in the a-axis direction is defined as a positive angle.

[14] The method for producing an epitaxial wafer described in [9], wherein the growth rate of the epitaxial layer is not less than 2.5 μm/h.

[15] The method for producing an epitaxial wafer described in [7], wherein an angle θ formed between the principal plane and the (001) plane of the β-Ga$_2$O$_3$-based single crystal is not less than −30° and not more than 30°, where an angle generated by rotation in a rotation direction of a right-handed screw advancing in the a-axis direction is defined as a positive angle.

[16] The method for producing an epitaxial wafer described in [8], wherein the angle θ is not less than 0.3° and not more than 15°, or not less than −15° and not more than −0.3°.

Advantageous Effects of Invention

According to the invention, it is possible to provide a semiconductor substrate comprising a β-Ga$_2$O$_3$-based single crystal on which an epitaxial layer comprising a β-Ga$_2$O$_3$-based single crystal can be grown by the HVPE method at a high growth rate; an epitaxial wafer having the semiconductor substrate and an epitaxial layer; and a method for producing the epitaxial wafer.

According to the invention, it is possible to provide a semiconductor substrate comprising a β-Ga$_2$O$_3$-based single crystal on which an epitaxial layer comprising a β-Ga$_2$O$_3$-based single crystal having good surface morphology can be grown by the HVPE method; an epitaxial wafer having the semiconductor substrate and an epitaxial layer; and a method for producing the epitaxial wafer.

DESCRIPTION OF EMBODIMENT

First Embodiment

Configuration of Crystalline Layered Structure

Figure 1:
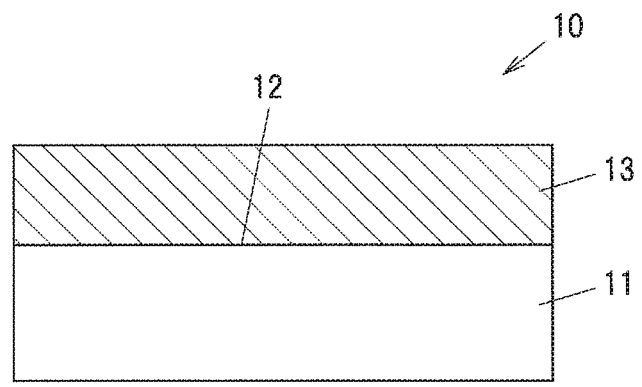
FIG. 1 is a vertical cross-sectional view showing an epitaxial wafer in the first embodiment.

FIG. 1 is a vertical cross-sectional view showing an epitaxial wafer 10 in the first embodiment. The epitaxial wafer 10 has a semiconductor substrate 11 and an epitaxial layer 13 formed on a principal plane 12 of the semiconductor substrate 11 by epitaxial crystal growth using the HVPE (Halide Vapor Phase Epitaxy) method.

The semiconductor substrate 11 is a substrate formed of a β-Ga$_2$O$_3$-based single crystal. The β-Ga$_2$O$_3$-based single crystal here means a β-Ga$_2$O$_3$ single crystal or a crystal of which base crystal is a β-Ga$_2$O$_3$ single crystal doped with an element such as Al or In. The composition of the β-Ga$_2$O$_3$ single crystal doped with, e.g., Al and In is expressed by β-(Ga$_x$Al$_y$In$_{(1-x-y)}$)$_2$O$_3$ (0<x≤1, 0≤y≤1, 0<x+y≤1). The band gap of the β-Ga$_2$O$_3$ single crystal is widened by adding Al and is narrowed by adding In. The semiconductor substrate 11 may also contain a conductive impurity such as Sn.

β-Ga$_2$O$_3$-based crystals have a β-gallia structure belonging to the monoclinic system and the typical lattice constants of β-Ga$_2$O$_3$ crystal not containing impurities are a$_0$=12.23 Å, b$_0$=3.04 Å, c$_0$=5.80 Å, α=γ=90° and β=103.8°.

To form the semiconductor substrate 11, for example, a bulk crystal of a Ga$_2$O$_3$-based single crystal grown by a melt-growth technique such as the FZ (Floating Zone) method or the EFG (Edge Defined Film Fed Growth) method is sliced and the surface thereof is then polished.

The principal plane 12 of the semiconductor substrate 11 is a plane parallel to a [100] axis of the β-Ga$_2$O$_3$-based single crystal which constitutes the semiconductor substrate 11. This is determined based on the finding by the present inventors that a growth rate of a β-Ga$_2$O$_3$-based single crystal layer epitaxially grown by the HVPE method and surface morphology of the β-Ga$_2$O$_3$-based single crystal layer can be controlled by adjusting an angle formed between the principal plane and the (100) plane of the β-Ga$_2$O$_3$-based single crystal when a plane orientation of the principal plane of the β-Ga$_2$O$_3$-based single crystal substrate is parallel to the [100] axis.

When the semiconductor substrate 11 has the principal plane 12 parallel to the [100] axis and is configured so that an angle formed between the principal plane 12 and a (001) plane of a β-Ga$_2$O$_3$-based single crystal constituting the semiconductor substrate 11 (hereinafter, referred to as "angle θ") is not less than −30° and not more than 30° where an angle generated by rotation in a rotation direction of a right-handed screw advancing in the a-axis direction of the semiconductor substrate 11 is defined as a positive angle, the growth rate of the epitaxial layer 13 formed by the HVPE method can be increased. Furthermore, the growth rate of the epitaxial layer 13 formed by the HVPE method can be further increased by adjusting the angle θ to not less than 0.3° and not more than 15°, or not less than −15° and not more than −0.3°.

In addition, surface morphology of the epitaxial layer 13 formed by the HVPE method can be improved by adjusting the angle θ to not less than 30° and not more than 90°, or not less than −150° and not more than −90° where an angle generated by rotation in a rotation direction of a right-handed screw advancing in the a-axis direction of the semiconductor substrate 11 is defined as a positive angle.

Furthermore, surface morphology of the epitaxial layer 13 can be further improved by setting the angle θ to a value close to 60° or −120°. When the semiconductor substrate 11 has, e.g., an average dislocation density of not more than 1×10$^4$/cm$^2$, the angle θ is set to not less than 54.3° and not more than 65.7°, or not less than −125.7° and not more than −114.3°. Then, when the semiconductor substrate 11 has an average dislocation density of not more than 1×10$^3$/cm$^2$, the angle θ is set to not less than 41.6° and not more than 78.4°, or not less than −138.4° and not more than −101.6°.

The β-Ga$_2$O$_3$-based single crystal has symmetry. Therefore, a plane coinciding with the (001) plane rotated about the [100] axis in the positive direction is equivalent to a plane coinciding with the (001) plane rotated in the negative direction. That is, the plane orientation of the principal plane 12 is equivalent regardless of whether the angle θ is positive or negative.

The epitaxial layer 13 is formed of a β-Ga$_2$O$_3$-based single crystal in the same manner as the semiconductor substrate 11. The epitaxial layer 13 may also contain a conductive impurity such as Si.

Structure of the Vapor Phase Deposition System

A structure of the vapor phase deposition system used for growing the epitaxial layer 13 in the first embodiment will be described below as an example.

Figure 2:
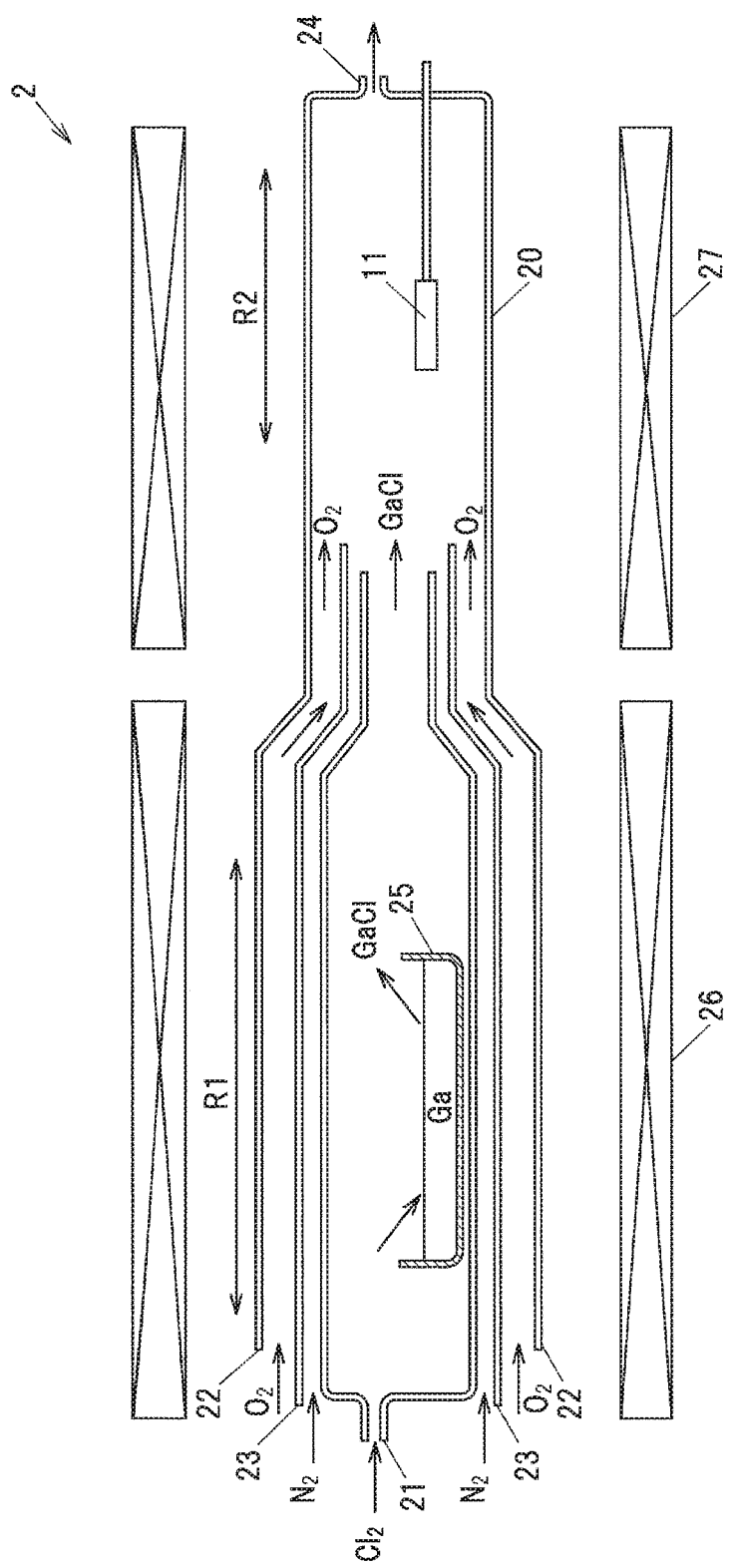
FIG. 2 is a vertical cross-sectional view showing a vapor phase deposition system in the embodiment.
Figure 3A:
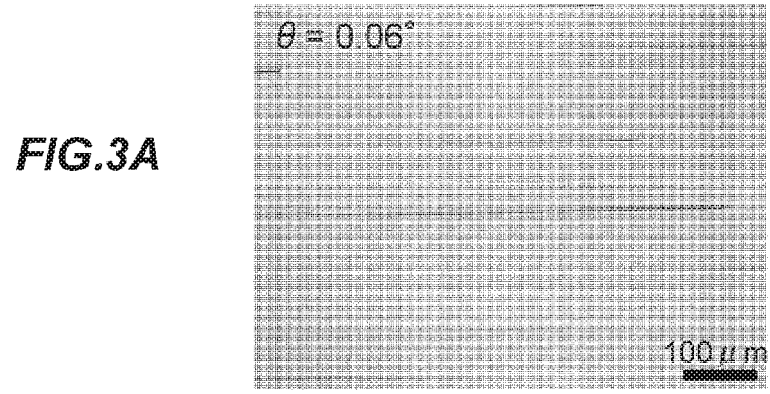
FIG. 3A is an optical microscope image showing a surface of an epitaxial layer.
Figure 3B:
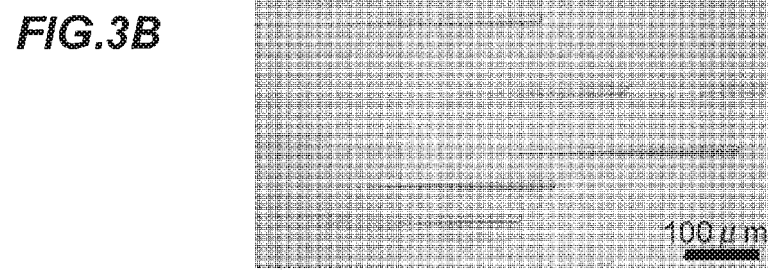
FIG. 3B is an optical microscope image showing a surface of an epitaxial layer.
Figure 3C:
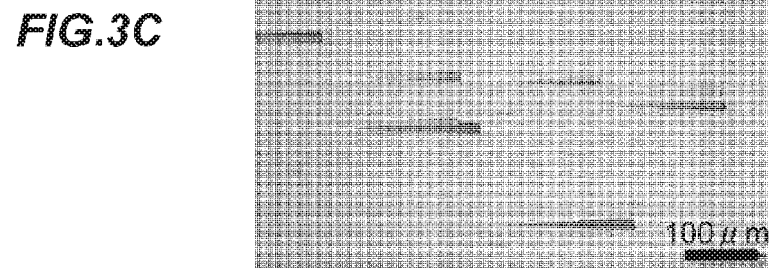
FIG. 3C is an optical microscope image showing a surface of an epitaxial layer.
Figure 3D:
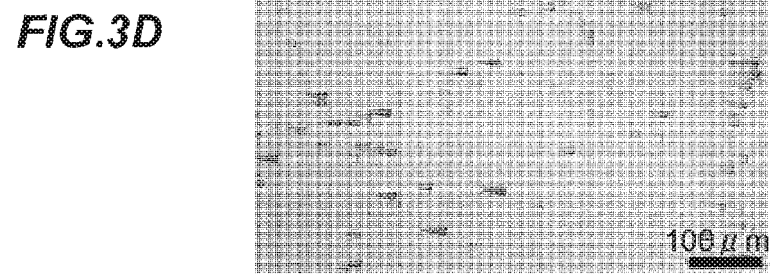
FIG. 3D is an optical microscope image showing a surface of an epitaxial layer.
Figure 4A:
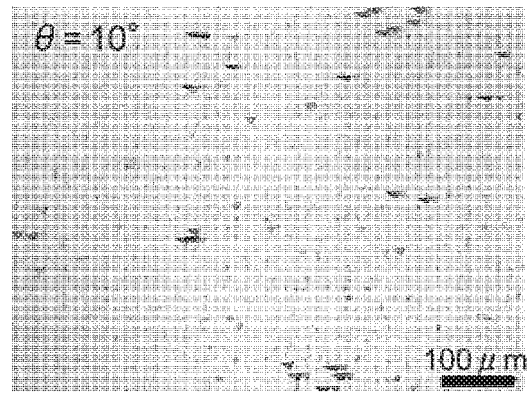
FIG. 4A is an optical microscope image showing a surface of an epitaxial layer.
Figure 4B:
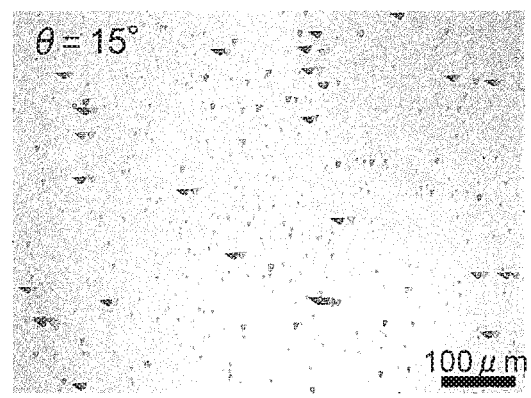
FIG. 4B is an optical microscope image showing a surface of an epitaxial layer.
Figure 4C:
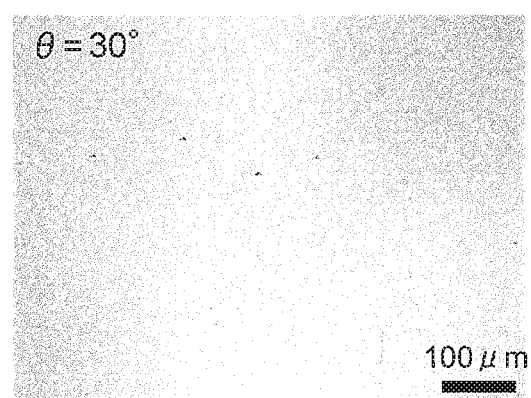
FIG. 4C is an optical microscope image showing a surface of an epitaxial layer.
Figure 4D:
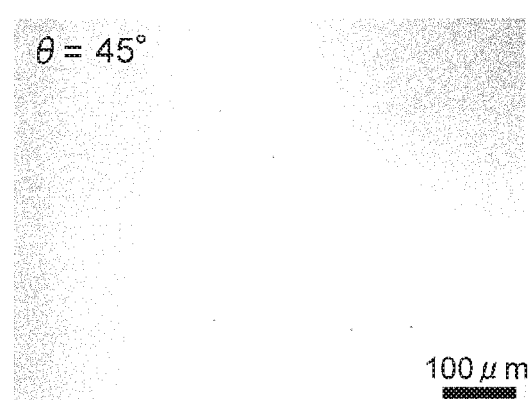
FIG. 4D is an optical microscope image showing a surface of an epitaxial layer.
Figure 5A:
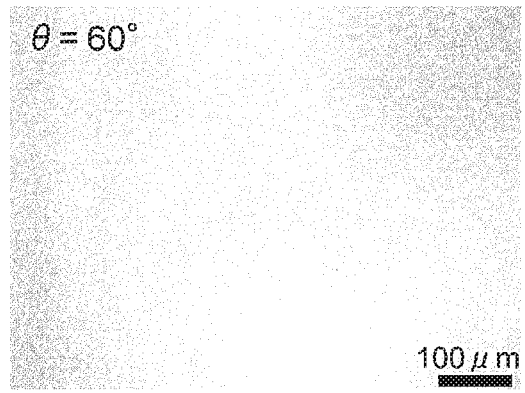
FIG. 5A is an optical microscope image showing a surface of an epitaxial layer.
Figure 5B:
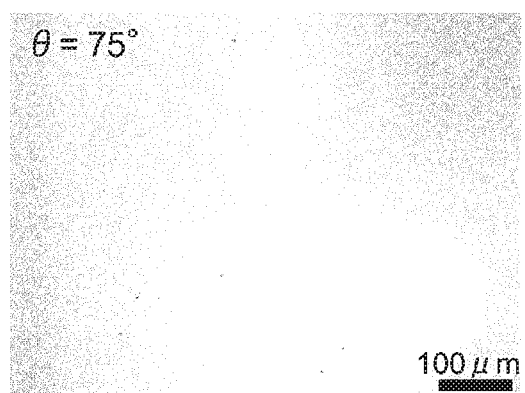
FIG. 5B is an optical microscope image showing a surface of an epitaxial layer.
Figure 5C:
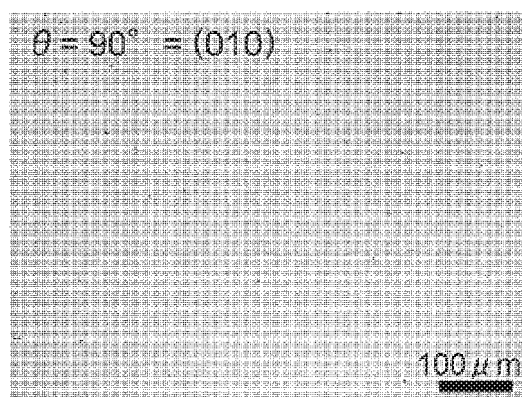
FIG. 5C is an optical microscope image showing a surface of an epitaxial layer.

FIG. 2 is a vertical cross-sectional view showing the vapor phase deposition system 2 in the embodiment. The vapor phase deposition system 2 is a vapor phase deposition system using HVPE technique, and has a reaction chamber 20 having a first gas introducing port 21, a second gas introducing port 22, a third gas introducing port 23 and an exhaust port 24, and a first heating means 26 and a second heating means 27 which are placed around the reaction chamber 20 to heat predetermined regions in the reaction chamber 20.

The film growth rate when using the HVPE technique is higher than that in the PLD method, etc. In addition, in-plane distribution of film thickness is highly uniform and it is possible to grow a large-diameter film. Therefore, it is suitable for mass production of crystal.

The reaction chamber 20 has a source reaction region R1 in which a reaction container 25 containing a Ga source is placed and a gallium source gas is produced, and a crystal growth region R2 in which the semiconductor substrate 11 is placed and the epitaxial layer 13 is grown thereon. The reaction chamber 20 is formed of, e.g., quartz glass.

Here, the reaction container 25 is formed of, e.g., quartz glass and the Ga source contained in the reaction container 25 is metal gallium.

The first heating means 26 and the second heating means 27 are capable of respectively heating the source reaction region R1 and the crystal growth region R2 of the reaction chamber 20. The first heating means 26 and the second heating means 27 are, e.g., resistive heaters or radiation heaters.

The first gas introducing port 21 is a port for introducing a Cl-containing gas (Cl$_2$ gas or HCl gas) into the source reaction region R1 of the reaction chamber 20 using an inert carrier gas (N$_2$ gas, Ar gas or He gas).

The second gas introducing port 22 is a port for introducing an oxygen-containing gas (O$_2$ gas or H$_2$O gas, etc.) as an oxygen source gas and a chloride gas (e.g., silicon tetrachloride, etc.) used to add a dopant such as Si to the epitaxial layer 13, into the crystal growth region R2 of the reaction chamber 20 using an inert carrier gas ($N_2$ gas, Ar gas or He gas).

The third gas introducing port 23 is a port for introducing an inert carrier gas ($N_2$ gas, Ar gas or He gas) into the crystal growth region R2 of the reaction chamber 20.

Growth of the Epitaxial Layer

A process of growing the epitaxial layer 13 in the present embodiment will be described below as an example.

Firstly, the source reaction region R1 of the reaction chamber 20 is heated by the first heating means 26 and an atmosphere temperature in the source reaction region R1 is then maintained at a predetermined temperature.

Next, in the source reaction region R1, a Cl-containing gas introduced through the first gas introducing port 21 using a carrier gas is reacted with the metal gallium in the reaction container 25 at the above-mentioned atmosphere temperature, thereby producing a gallium chloride gas.

The atmosphere temperature in the source reaction region R1 here is preferably a temperature at which GaCl gas has the highest partial pressure among component gases of the gallium chloride gas produced by the reaction of the metal gallium in the reaction container 25 with the Cl-containing gas. The gallium chloride gas here contains GaCl gas, $GaCl_2$ gas, $GaCl_3$ gas and $(GaCl_3)_2$ gas, etc.

The temperature at which a driving force for growth of $Ga_2O_3$ crystal is maintained is the highest with the GaCl gas among the gases contained in the gallium chloride gas. Growth at a high temperature is effective to obtain a high-quality $Ga_2O_3$ crystal with high purity. Therefore, for growing the epitaxial layer 13, it is preferable to produce a gallium chloride gas in which a partial pressure of GaCl gas having a high driving force for growth at a high temperature is high.

If hydrogen is contained in an atmosphere for growing the epitaxial layer 13, surface flatness and a driving force for crystal growth of the epitaxial layer 13 decrease. Therefore, it is preferable that a $Cl_2$ gas not containing hydrogen be used as the Cl-containing gas.

In addition, to increase a partial pressure ratio of the GaCl gas in the gallium chloride gas, it is preferable that the metal gallium in the reaction container 25 be reacted with the Cl-containing gas in a state that the atmosphere temperature in the source reaction region R1 is maintained at not less than 300° C. by using the first heating means 26.

Meanwhile, at the atmosphere temperature of, e.g., not less than 850° C., the partial pressure ratio of the GaCl gas is predominantly high (the equilibrium partial pressure of the GaCl gas is four orders of magnitude greater than the $GaCl_2$ gas and is eight orders of magnitude greater than the $GaCl_3$ gas) and the gases other than GaCl gas hardly contribute to the growth of $Ga_2O_3$ crystal.

Considering the lifetime of the first heating means 26 and heat resistance of the reaction chamber 20 formed of quartz glass, etc., it is preferable that the metal gallium in the reaction container 25 be reacted with the Cl-containing gas in a state that the atmosphere temperature in the source reaction region R1 is maintained at not more than 1000° C.

Next, in the crystal growth region R2, the gallium chloride gas produced in the source reaction region R1 is mixed with the oxygen-containing gas introduced through the second gas introducing port 22 and the semiconductor substrate 11 is exposed to the resulting mixed gas, thereby epitaxially growing the epitaxial layer 13 on the semiconductor substrate 11. At this time, in a furnace housing the reaction chamber 20, pressure in the crystal growth region R2 is maintained at, e.g., 1 atm.

When forming the epitaxial layer 13 containing an additive element such as Si or Al, a source gas of the additive element (e.g., a chloride gas such as silicon tetrachloride ($SiCl_4$)) is introduced, together with the gallium chloride gas and the oxygen-containing gas, into the crystal growth region R2 through the gas introducing port 22.

If hydrogen is contained in an atmosphere for growing the epitaxial layer 13, surface flatness and a driving force for crystal growth of the epitaxial layer 13 decrease. Therefore, it is preferable that an $O_2$ gas not containing hydrogen be used as the oxygen-containing gas.

In addition, to suppress an increase in the equilibrium partial pressure of the GaCl gas and to efficiently grow the epitaxial layer 13, the epitaxial layer 13 is preferably grown in a state that a ratio of the supplied partial pressure of the $O_2$ gas to the supplied partial pressure of the GaCl gas in the crystal growth region R2 is not less than 0.5.

In addition, the growth temperature is preferably not less than 900° C. to grow a high-quality epitaxial layer 13.

The epitaxial layer 13 contains, e.g., not more than $5 \times 10^{16}$ (atoms/$cm^3$) of Cl. This results from that the epitaxial layer 13 is formed by the HVPE method using Cl-containing gas. Generally, Cl-containing gas is not used to form a $Ga_2O_3$ single crystal film when using a method other than the HVPE method, and the $Ga_2O_3$ single crystal film does not contain Cl, or at least does not contain $1 \times 10^{16}$ (atoms/$cm^3$) or more of Cl.

Evaluation of Surface Morphology of Epitaxial Layer

A relation between the angle θ, which is formed between the principal plane 12 and the (001) plane of the β-$Ga_2O_3$ single crystal constituting the semiconductor substrate 11, and surface morphology of the epitaxial layer 13 was evaluated. The result is as follows.

FIGS. 3A to 3D, 4A to 4D and 5A to 5C are optical microscope images showing surfaces of epitaxial layers. For the angle θ of the semiconductor substrate 11 as an underlying for the epitaxial layer 13, the value is indicated at the top left of each image.

The epitaxial layers 13 shown in FIGS. 3A to 3D, 4A to 4D and 5A to 5C are β-$Ga_2O_3$ single crystal layers grown on the semiconductor substrates 11 formed of β-$Ga_2O_3$ single crystal.

FIGS. 3A to 3D, 4A to 4D and 5A to 5C show that the more the angle θ becomes closer to 90° from 0°, the shorter the length of the V-shaped groove appeared on the surface of the epitaxial layer 13 and the better the surface morphology.

Now, the V-shaped groove which deteriorates surface morphology of the epitaxial layer 13 will be described using FIGS. 6 (*a*) and (*b*).

Figure 6:
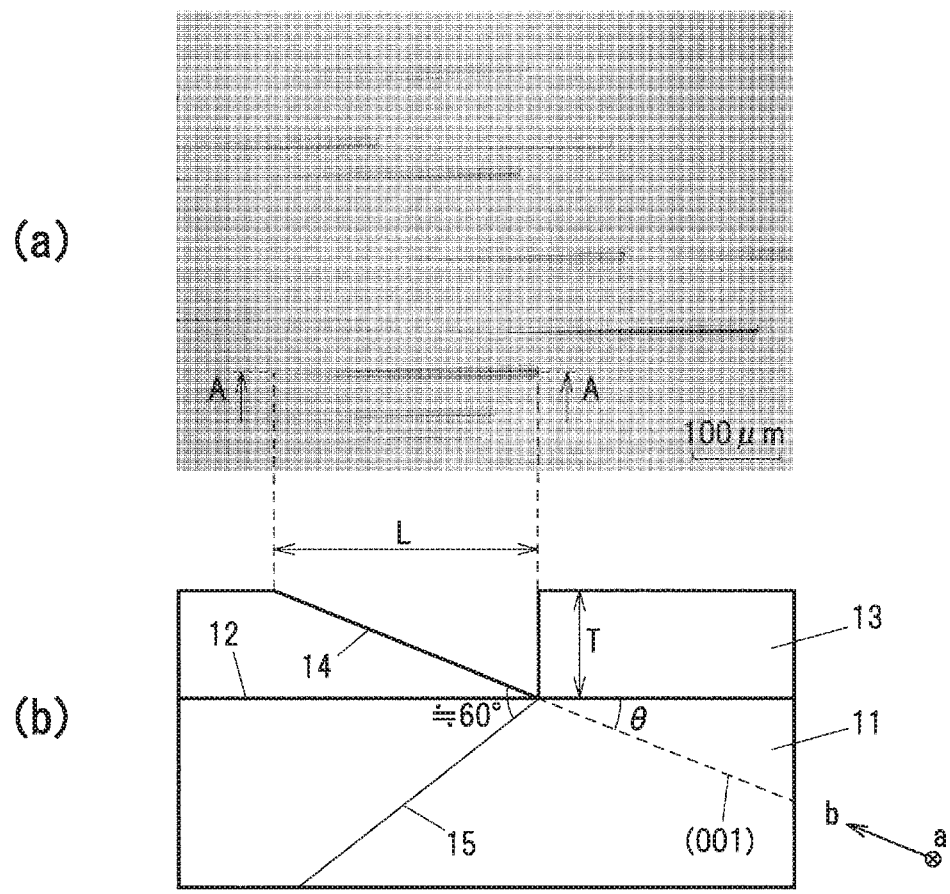
FIGS. 6 (*a*) and (*b*) are an optical microscope image showing a surface of an epitaxial layer and a schematic vertical cross-sectional view showing the epitaxial layer taken along a line A-A in (a), respectively.

FIG. 6 (*a*) is an optical microscope image showing a surface of the epitaxial layer 13 and FIG. 6 (*b*) is a schematic vertical cross-sectional view showing the epitaxial layer 13 taken along a line A-A in FIG. 6 (*a*). "L" and "T" in FIG. 6 (*b*) respectively indicate the length of the V-shaped groove and the thickness of the epitaxial layer 13 (the depth of the V-shaped groove). The angle θ of the semiconductor substrate 11 shown in FIG. 6 (*a*) is about +0.75°.

It is considered that dislocations in the semiconductor substrate 11 propagate into the epitaxial layer 13 and the V-shaped grooves are thereby formed. The inventors of the present application found that a dislocation line 15 inside the semiconductor substrate 11, which is a starting point of V-shaped groove on the epitaxial layer 13, appears at a position where the [010] axis is located when rotated by about 60° in a rotation direction of a left-handed screw advancing in the a-axis direction of the semiconductor substrate 11 (in a counterclockwise direction in FIG. 6 (b)).

Figure 7A:
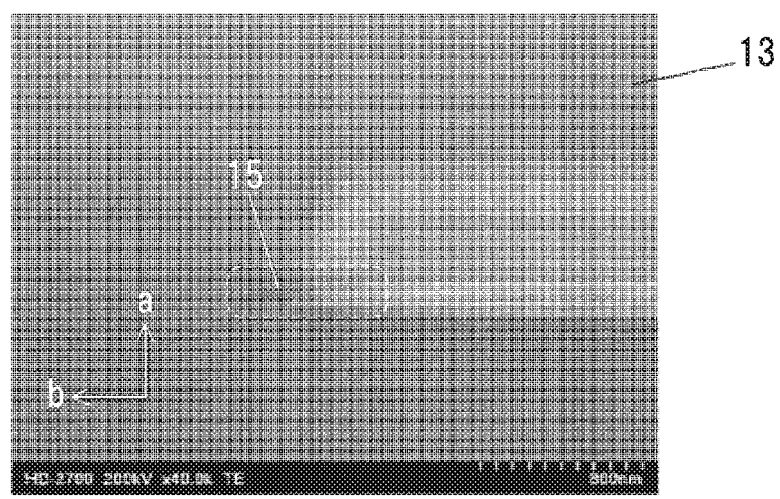
FIG. 7A is a scanning transmission electron microscope (STEM) bright-field image showing an upper surface of an epitaxial wafer.
Figure 7B:
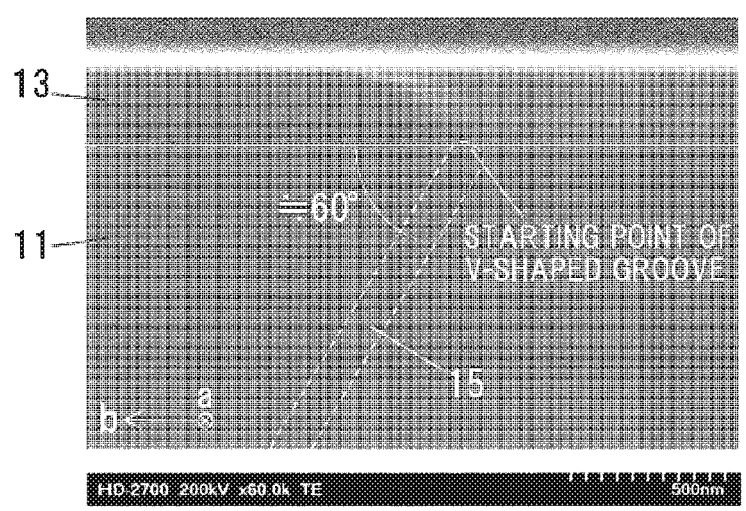
FIG. 7B is a scanning transmission electron microscope (STEM) bright-field image showing a vertical cross section of the epitaxial wafer.

FIGS. 7A and 7B are scanning transmission electron microscope (STEM) bright-field images respectively showing the upper surface and the vertical cross section of the epitaxial wafer 10. The angle θ of the semiconductor substrate 11 shown in FIGS. 7A and 7B is about −0.8°. The dislocation line 15 inside the semiconductor substrate 11 can be seen in these images.

An angle formed between a straight line 14 of the bottom of the V-shaped groove and the principal plane 12 of the semiconductor substrate 11 is equal to the angle θ as described later. The angle θ in the epitaxial wafer 10 shown in FIG. 7A is as small as −0.8° and, in the STEM image with high magnification in FIG. 7B, the straight line 14 of the bottom of the V-shaped groove thus appears to coincide with the principal plane 12. Meanwhile, the side surface of the V-shaped groove is substantially perpendicular to the principal plane 12 as shown in FIG. 6 (b) but can be inclined in a very thin region in the vicinity of the principal plane 12. The semiconductor substrate 11 and the epitaxial layer 13 shown in FIG. 7A are thinned for the purpose of STEM observation, and the inclined side surface of the V-shaped groove in the vicinity of the principal plane 12 is shown in FIG. 7A.

When the angle θ is set to 60°, the dislocation lines 15 inside the semiconductor substrate 11 become parallel to the principal plane 12 and dislocations do not appear on the principal plane 12. Thus, propagation of dislocations from the semiconductor substrate 11 into the epitaxial layer 13 hardly occurs. Also when the angle θ is −120°, the dislocation lines 15 become parallel to the principal plane 12 and the length L of the V-shaped groove is thus substantially zero.

Even when the dislocation lines 15 are not completely parallel to the principal plane 12, distances between dislocations appeared on the principal plane 12 (appeared at intersections of the principal plane 12 and the dislocation lines 15) increase as closer to parallel.

Figure 8A:
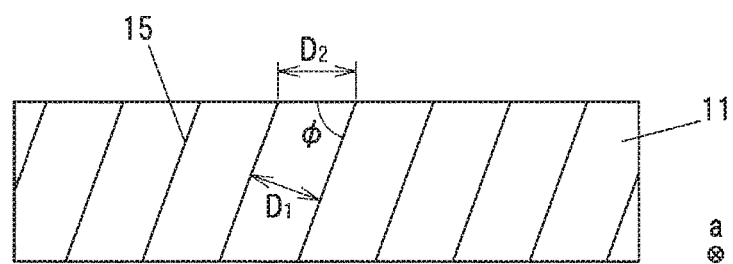
FIG. 8A is a conceptual diagram illustrating a relation between an angle φ, which is formed between a dislocation line and a principal plane, and a distance D$_2$ between dislocations appeared on the principal plane.
Figure 8B:
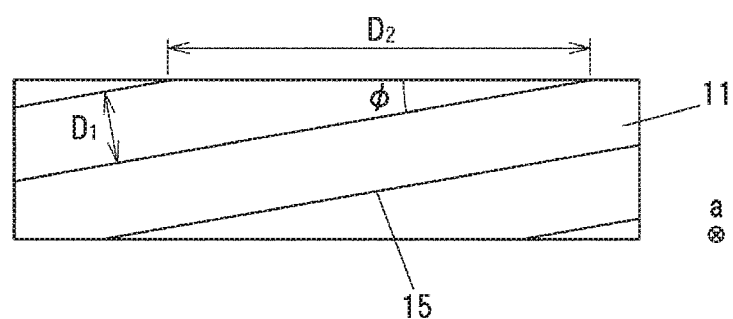
FIG. 8B is a conceptual diagram illustrating a relation between the angle φ, which is formed between a dislocation line and the principal plane, and the distance D$_2$ between dislocations appeared on the principal plane.

FIGS. 8A and 8B are conceptual diagrams illustrating a relation between an angle φ, which is formed between the dislocation line 15 and the principal plane 12, and a distance $D_2$ between dislocations appeared on the principal plane 12. These conceptual diagrams are given on the assumption that the dislocation lines 15 are aligned at regular intervals.

When a distance between the dislocation lines 15 is defined as $D_1$, the distance $D_2$ between dislocations appeared on the principal plane 12 is equal to $D_1/\sin \varphi$. Therefore, when the angle φ is changed on the assumption that the distance $D_1$ is always the same, the dislocation lines 15 become perpendicular to the principal plane 12 at φ=90° (when the angle θ is 150° or −30°), and the distance $D_2$ becomes equal to the distance $D_1$ and is the smallest. Then, with the angle (9 of closer to 0° (the angle θ of about 60° or −120°), the dislocation lines 15 are closer to parallel to the principal plane 12 and the distance $D_2$ increases.

When the semiconductor substrate 11 has, e.g., an average dislocation density of not more than $1\times10^4/cm^2$, the average distance $D_1$ between the dislocation lines 15 is 100 μm. In this case, when the absolute value of φ is smaller than about 5.7°, the distance $D_2$ between dislocations appeared on the principal plane 12 is greater than 100 μm. That is, an average number of dislocations appeared on the principal plane 12 is less than 1/mm².

Table 1 below shows a relation between the average dislocation density of the semiconductor substrate 11 and the angle φ when the average number of dislocations appeared on the principal plane 12 is less than 1/mm².

TABLE 1

| Average dislocation density of Semiconductor substrate | Distance $D_2$ | Angle φ |
| --- | --- | --- |
| $1 \times 10^5/cm^2$ | 32 μm | −1.8° ≤ φ ≤ 1.8° |
| $1 \times 10^4/cm^2$ | 100 μm | −5.7° ≤ φ ≤ 5.7° |
| $1 \times 10^3/cm^2$ | 316 μm | −18.4° ≤ φ ≤ 18.4° |
| $1 \times 10^2/cm^2$ | 1000 μm | φ ≠ 90° |

φ is 0° when the angle θ is about 60° or −120°. Therefore, according to Table 1, when the semiconductor substrate 11 has an average dislocation density of not more than $1\times10^5/cm^2$, the average number of dislocations appeared on the principal plane 12 can be 1/mm² by setting the angle θ to not less than 58.2° and not more than 61.8°, or not less than −121.8° and not more than −118.2°.

In addition, when the semiconductor substrate 11 has an average dislocation density of not more than $1\times10^4/cm^2$, the average number of dislocations appeared on the principal plane 12 can be 1/mm² by setting the angle θ to not less than 54.3° and not more than 65.7°, or not less than −125.7° and not more than −114.3°.

Furthermore, when the semiconductor substrate 11 has an average dislocation density of not more than $1\times10^3/cm^2$, the average number of dislocations appeared on the principal plane 12 can be 1/mm² by setting the angle θ to not less than 41.6° and not more than 78.4°, or not less than −138.4° and not more than −101.6°.

Furthermore, when the semiconductor substrate 11 has an average dislocation density of not more than $1\times10^2/cm^2$, the average number of dislocations appeared on the principal plane 12 can be 1/mm² by setting the angle θ to a value other than −30° and 150°.

Meanwhile, the straight line 14 of the bottom of the V-shaped groove is parallel to the [010] axis of the β-Ga$_2$O$_3$ single crystal constituting the semiconductor substrate 11. Since the cross section shown in FIG. 6 (b) is parallel to the b-axis of the β-Ga$_2$O$_3$-based single crystal constituting the semiconductor substrate 11, the (001) plane of the semiconductor substrate 11 seen in this cross section coincides with the [010] axis. Thus, the angle θ formed between the principal plane 12 of the semiconductor substrate 11 and the [010] axis is equal to an angle formed between the principal plane 12 and the (001) plane (an angle formed between the straight line 14 of the bottom of the V-shaped groove and the principal plane 12) as shown in FIG. 6 (b). Therefore, according to the calculation, the length L of the V-shaped groove becomes shorter as the angle θ becomes closer to 90°.

Figure 9:
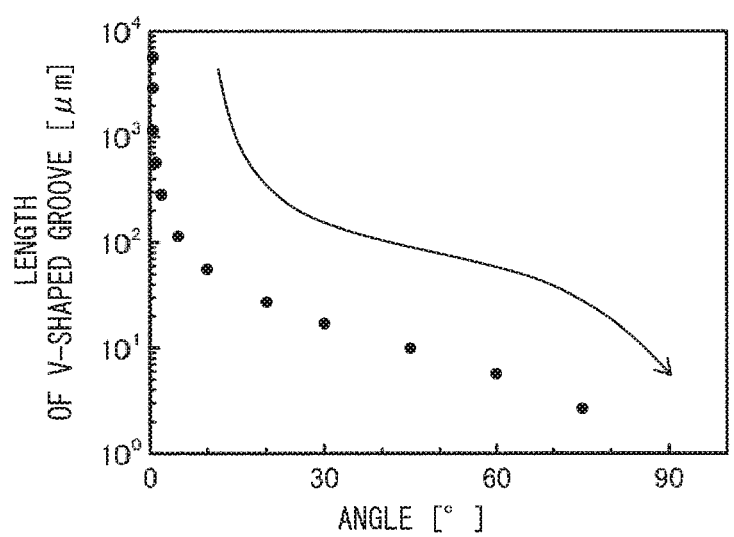
FIG. 9 is a graph plotting data showing a relation between an angle θ and the calculated length L of a V-shaped groove.

FIG. 9 is a graph plotting data showing a relation between the length L of the V-shaped groove and the angle θ where an angle generated by rotation in a rotation direction of a right-handed screw advancing in the a-axis direction of the semiconductor substrate 11 is defined as a positive angle. The length L of the V-shaped groove indicated on the vertical axis in FIG. 9 is the calculated value obtained from the equation L=T/tan θ when the thickness T of the epitaxial layer 13 is 10 μm.

Based on the curved line shown in FIG. 9, the length L of the V-shaped groove sharply decreases as θ becomes further from 0°, the curvature becomes substantially zero at around 30°, and after that, the length L of the V-shaped groove decreases gradually. Thus, to reduce the length L of the V-shaped groove, the angle θ is preferably not less than 30° and not more than 90°, and not less than −150° and not more than −90° equivalent thereto.

Table 2 below shows a relation between the angle θ, where an angle generated by rotation in a rotation direction of a right-handed screw advancing in the a-axis direction of the semiconductor substrate 11 is defined as a positive angle, and the measured values and the calculated values of the length L of the V-shaped groove.

TABLE 2

| Angle θ [°] | Thickness T [μm] | Length L [μm] | |
|---|---|---|---|
| | | Measured value | Calculated value |
| 0.06 | 2.7 | 500 | 2500 |
| 0.33 | 4.5 | 350 | 780 |
| 1.41 | 5.8 | 200 | 230 |
| 5 | 4.6 | 65 | 53 |
| 10 | 4.1 | 30 | 23 |
| 15 | 4.7 | 20 | 18 |
| 30 | 2.6 | 5.0 | 4.5 |
| 45 | 1.5 | ≈0 | 1.5 |
| 60 | 1.3 | ≈0 | 0.8 |
| 75 | 2.0 | ≈0 | 0.5 |
| 90 | 1.0 | ≈0 | 0 |

Among the measured values of the length L of the V-shaped groove shown in Table 2, the value at the angle θ of 60° is substantially zero. This is because the dislocation lines 15 become parallel to the principal plane 12 and dislocations do not appear on the principal plane 12 and do not propagate into the epitaxial layer 13 as described above. The calculated values do not become zero since the calculation is performed on the assumption that dislocations propagate into the epitaxial layer 13.

Meanwhile, the measured values of the length L of the V-shaped groove at the angle θ of 45° and 75° are smaller than the calculated values and are substantially zero. This is because when the length L of the V-shaped groove is smaller than the thickness T of the epitaxial layer 13, the V-shaped groove is filled with the growing crystal in the process of growth and becomes shallow, and the length L becomes too short to measure by an optical microscope. When the length L is not more than about 0.5 μm, it is difficult to find by an optical microscope. Also when the angle θ is −135° and −105°, the length L of the V-shaped groove is too short to measure by an optical microscope and the measured values are substantially zero.

The measured value of the length L of the V-shaped groove is substantially zero also when the angle θ is 90°. It is considered that this is because the [010] axis of the semiconductor substrate 11 is perpendicular to the principal plane 12 and the straight line 14 of the bottom of the V-shaped groove is thus perpendicular to the principal plane 12. Also when the angle θ is −90°, the [010] axis of the semiconductor substrate 11 is perpendicular to the principal plane 12 and the measured value of the length L of the V-shaped groove is substantially zero.

As such, by setting the angle θ to not less than 45° and not more than 90° or not less than −135° and not more than −90°, it is possible to reduce the length L of the V-shaped groove down to the unmeasurable level by an optical microscope.

In addition, according to Table 2, the measured values of the length L of the V-shaped groove are smaller than the calculated values when the angle θ is small (θ=0.06 and 0.33). This is because the V-shaped groove is filled with the growing crystal in the process of growth of the epitaxial layer 13 and becomes shallow.

Based on the measured value of L, the depth of the V-shaped groove (the length from the surface of the epitaxial layer 13 to the lowest portion of the V-shaped groove) at θ=0.06 and 0.33 was calculated and the obtained values were respectively 0.52 μm and 2.01 μm which are smaller than the thickness of the epitaxial layer 13 shown in Table 2. This shows that the V-shaped groove was filled in the process of crystal growth when θ=0.06 and 0.33.

FIGS. 10A to 10F are schematic diagrams illustrating change in shape of the V-shaped groove when the angle θ is increased in the positive direction (in a rotation direction of a right-handed screw advancing in the a-axis direction of the semiconductor substrate 11).

FIGS. 11A to 11F are schematic diagrams illustrating change in shape of the V-shaped groove when the angle θ is increased in the negative direction (in a rotation direction of a left-handed screw advancing in the a-axis direction of the semiconductor substrate 11).

Figure 10A:
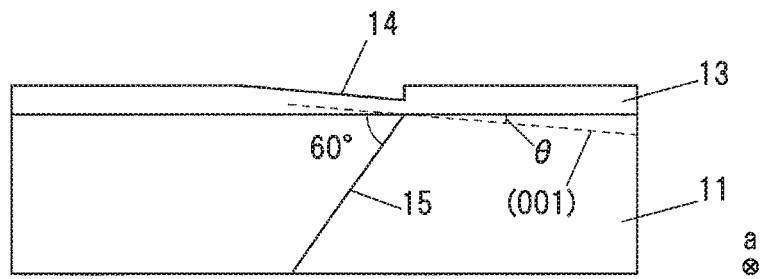
FIG. 10A is a schematic diagram illustrating change in shape of the V-shaped groove when the angle θ is increased in the positive direction (in a rotation direction of a right-handed screw advancing in the a-axis direction of the semiconductor substrate).
Figure 10B:
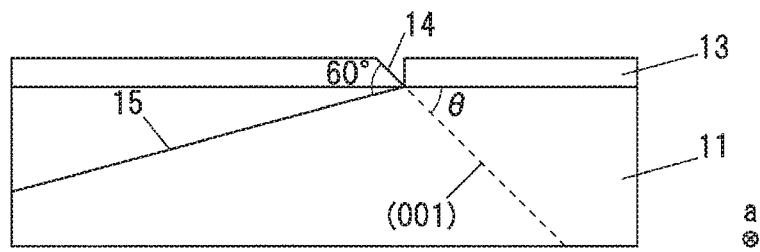
FIG. 10B is a schematic diagram illustrating change in shape of the V-shaped groove when the angle θ is increased in the positive direction.
Figure 10C:
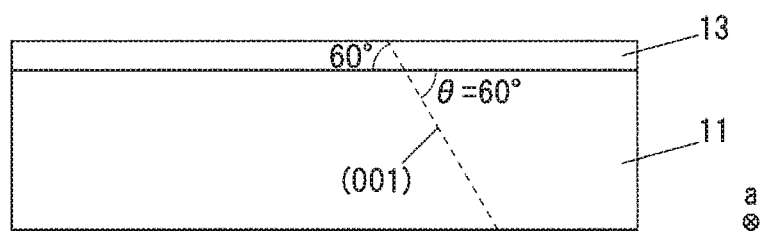
FIG. 10C is a schematic diagram illustrating change in shape of the V-shaped groove when the angle θ is increased in the positive direction.
Figure 11A:
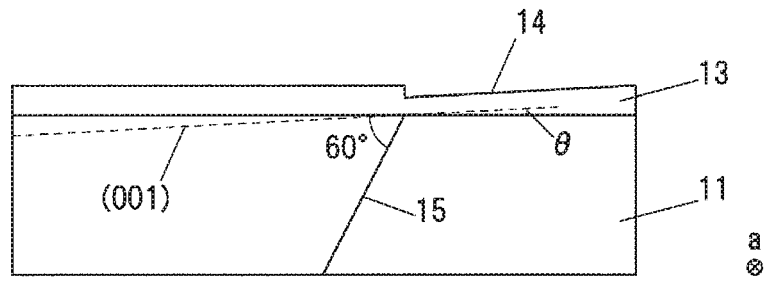
FIG. 11A is a schematic diagram illustrating change in shape of the V-shaped groove when the angle θ is increased in the negative direction (in a rotation direction of a left-handed screw advancing in the a-axis direction of the semiconductor substrate).
Figure 11B:
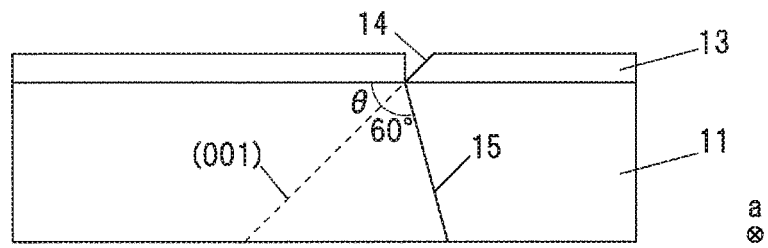
FIG. 11B is a schematic diagram illustrating change in shape of the V-shaped groove when the angle θ is increased in the negative direction.
Figure 11C:
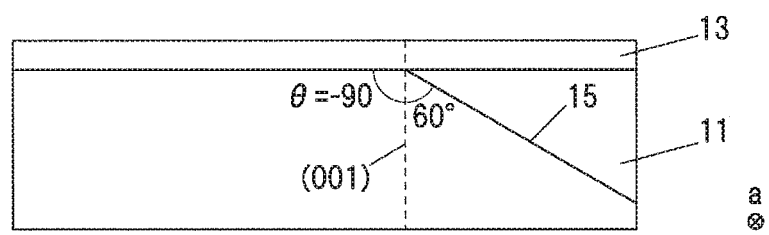
FIG. 11C is a schematic diagram illustrating change in shape of the V-shaped groove when the angle θ is increased in the negative direction.

FIGS. 10A and 11A show the states in which the V-shaped groove is shallow and the lowest portion thereof is distant from the principal plane 12 of the semiconductor substrate 11. The states at the angle θ of more than 0° and not more than 0.33° and at the angle θ of less than 0° and not less than −0.33° described above correspond to the states shown in FIGS. 10A and 11A. Thus, it is possible to remove the V-shaped groove by performing a polishing process such as CMP (Chemical Mechanical Polishing) on the surface of the epitaxial layer 13. On the other hand, when the lowest portion of the V-shaped groove reaches the principal plane 12 of the semiconductor substrate 11, it is not possible to remove the V-shaped groove while leaving a portion of the epitaxial layer 13.

At θ=0°, the straight line 14 of the bottom of the V-shaped groove is parallel to the principal plane 12 and the length L of the V-shaped groove thus is very large (theoretically, infinity). Also in this case, the V-shaped groove is filled with the growing crystal in the process of growth of the epitaxial layer 13 and becomes shallow.

Figure 10D:
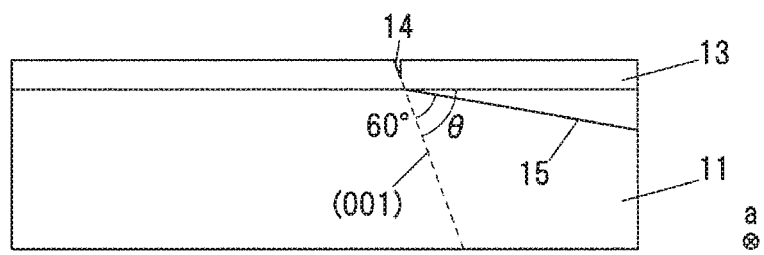
FIG. 10D is a schematic diagram illustrating change in shape of the V-shaped groove when the angle θ is increased in the positive direction.
Figure 10E:
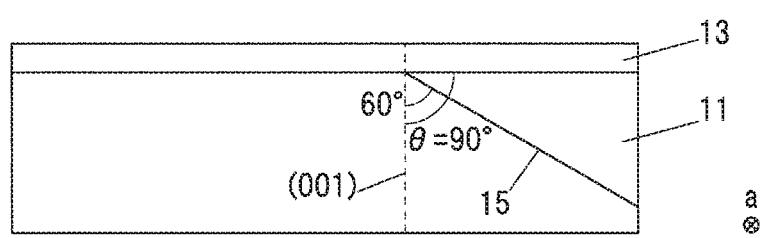
FIG. 10E is a schematic diagram illustrating change in shape of the V-shaped groove when the angle θ is increased in the positive direction.
Figure 10F:
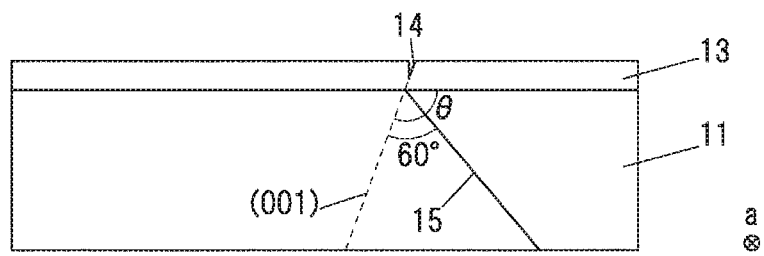
FIG. 10F is a schematic diagram illustrating change in shape of the V-shaped groove when the angle θ is increased in the positive direction.
Figure 11D:
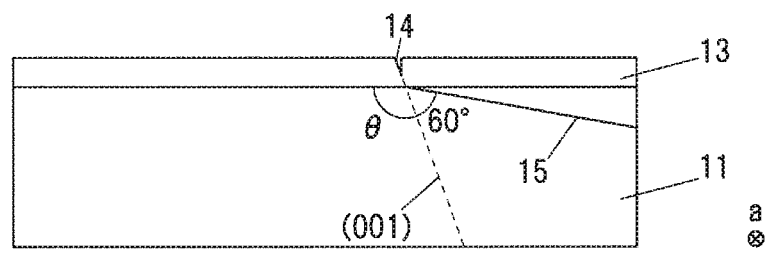
FIG. 11D is a schematic diagram illustrating change in shape of the V-shaped groove when the angle θ is increased in the negative direction.
Figure 11E:
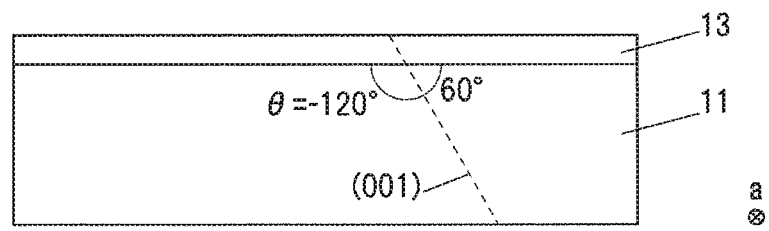
FIG. 11E is a schematic diagram illustrating change in shape of the V-shaped groove when the angle θ is increased in the negative direction.
Figure 11F:
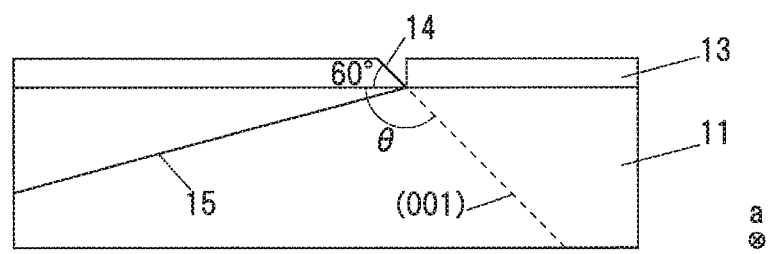
FIG. 11F is a schematic diagram illustrating change in shape of the V-shaped groove when the angle θ is increased in the negative direction.

In addition, when the length L of the V-shaped groove is smaller than the thickness T of the epitaxial layer 13, the V-shaped groove is filled with the growing crystal in the process of growth and becomes shallow, as described above. In other words, when the angle θ is more than 45° and not more than 90° and when the angle θ is less than −45° and not less than −90°, the V-shaped groove becomes shallow. Thus, the V-shaped grooves shown in FIGS. 10D, 10F and 11D are shallow by being filled with the growing crystal and the lowest portions thereof are distant from the principal plane 12 of the semiconductor substrate 11.

Therefore, when the angle θ is not less than −0.33° and not more than 0.33°, more than 45° and not more than 90°, or less than −45° and not less than −90°, it is possible to remove the V-shaped groove by polishing the surface of the epitaxial layer 13.

Figure 12A:
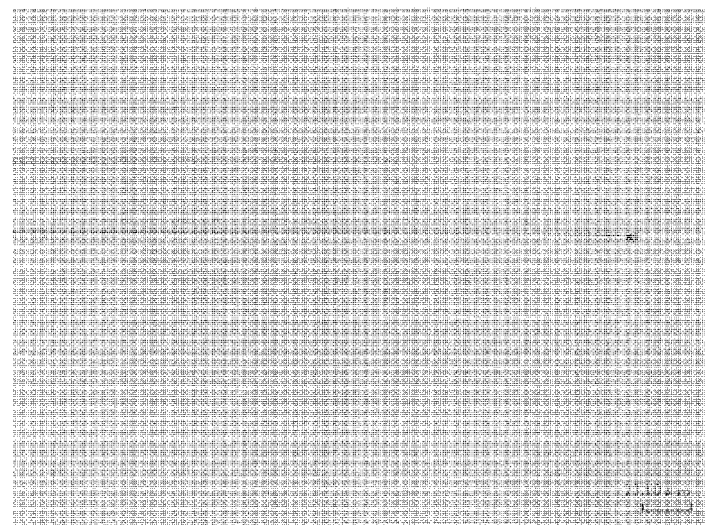
FIG. 12A is an optical microscope image showing the pre-CMP surface of the epitaxial layer on the semiconductor substrate with the angle θ of 0.06°.
Figure 12B:
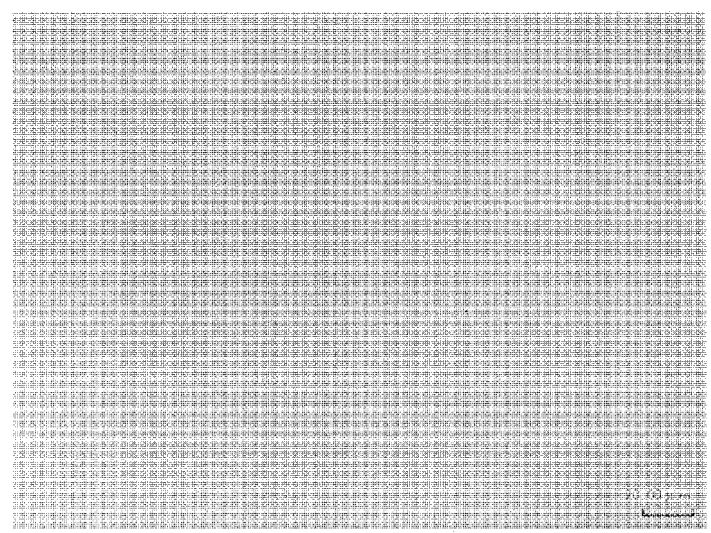
FIG. 12B is an optical microscope image showing the post-CMP surface of the epitaxial layer on the semiconductor substrate with the angle θ of 0.06°.

FIGS. 12A and 12B are optical microscope images showing the surface of the epitaxial layer 13 on the semiconductor substrate 11 with the angle θ of 0.06°, wherein FIG. 12A is an image before CMP and FIG. 12B is an image after CMP. FIGS. 12A and 12B show that the V-shaped groove was removed while leaving a portion of the epitaxial layer 13.

Similar evaluation results are obtained also when the semiconductor substrate 11 and the epitaxial layer 13 are respectively formed of β-Ga$_2$O$_3$-based single crystals other than the β-Ga$_2$O$_3$ single crystal.

Evaluation of Growth Rate of Epitaxial Layer

Table 3 below shows a relation between offset angles of the principal plane of a β-Ga$_2$O$_3$ substrate from the (001) plane in the [100] axis direction and the [010] axis direction and the growth rate of a β-Ga$_2$O$_3$ layer formed on the β-Ga$_2$O$_3$ substrate by the HVPE method.

TABLE 3

| Offset angle [°] | | |
|---|---|---|
| [100] axis direction | [010] axis direction | Growth rate [μm/h] |
| −0.04 | +0.78 | 6.0 |
| +1.00 | +0.50 | 4.3 |
| −3.85 | +0.33 | 4.5 |
| −1.20 | +0.06 | 2.7 |
| −0.02 | −0.05 | 3.35 |
| +0.85 | −0.44 | 4.5 |
| +1.16 | −1.41 | 5.8 |

Table 3 shows that the growth rate of the β-Ga$_2$O$_3$ layer is, e.g., 6.0 μm/h when grown on the β-Ga$_2$O$_3$ substrate of which principal plane is inclined by −0.04° in the [100] axis direction and 0.78° in the [010] axis direction from the (001) plane.

Figure 13A:
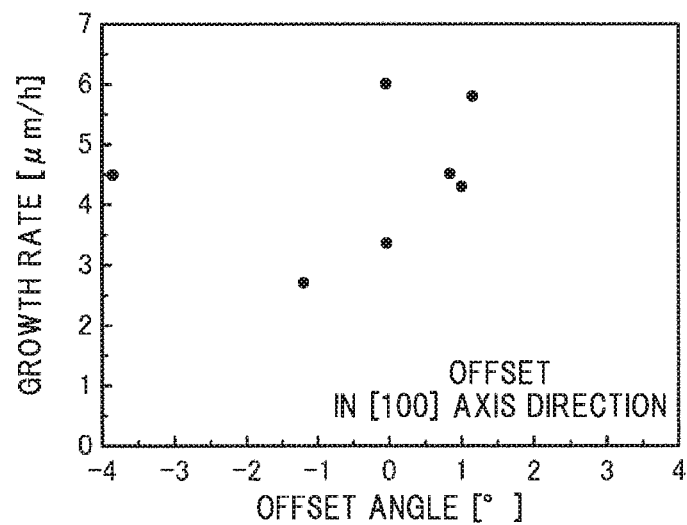
FIG. 13A is a graph plotting data showing a relation between an offset angle from a (001) plane in a [100] axis direction and the growth rate of β-Ga$_2$O$_3$ layer shown in Table 3.

FIG. 13A is a graph plotting data showing a relation between an offset angle from the (001) plane in the [100] axis direction and the growth rate of the β-Ga$_2$O$_3$ layer shown in Table 3. FIG. 8B is a graph plotting data showing a relation between an offset angle from the (001) plane in the [010] axis direction and the growth rate of the β-Ga$_2$O$_3$ layer shown in Table 3.

As shown in FIG. 13A, no regularity is found in the relation between the growth rate and the offset angle from the (001) plane in the [100] axis direction, and clear dependence of the growth rate on the offset angle in the [100] axis direction is not identified.

Figure 13B:
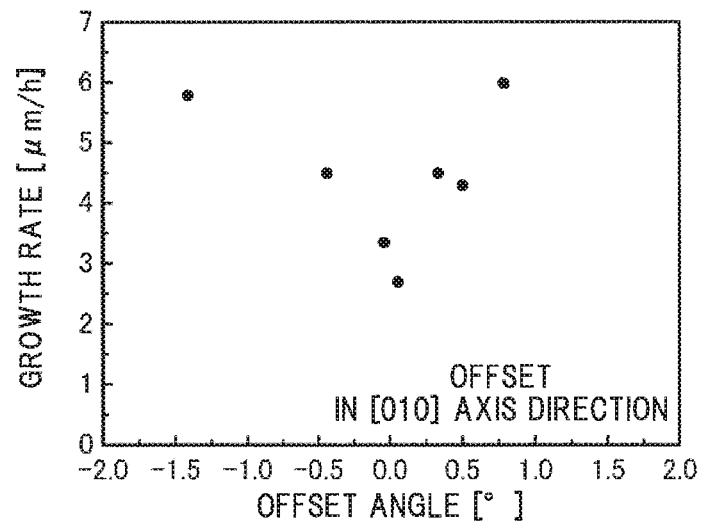
FIG. 13B is a graph plotting data showing a relation between an offset angle from the (001) plane in a [010] axis direction and the growth rate of the β-Ga$_2$O$_3$ layer shown in Table 3.

On the other hand, as shown in FIG. 13B, in the relation between the growth rate and the offset angle from the (001) plane in the [010] axis direction, the growth rate is the lowest at the offset angle of around 0° and increases as the offset angle becomes further from 00°.

Table 4 below shows a relation between the angle θ of the semiconductor substrate 11 formed of a β-Ga$_2$O$_3$ single crystal, i.e., the offset angle from the (001) plane in the [010] axis direction, and the growth rate of the epitaxial layer 13 formed of a β-Ga$_2$O$_3$ single crystal.

TABLE 4

| Angle θ [°] | Growth rate [μm/h] |
|---|---|
| 0.05 | 3.35 |
| 0.06 | 2.7 |
| 0.33 | 4.5 |
| 0.44 | 4.5 |
| 0.5 | 4.3 |
| 0.78 | 6.0 |
| 1.41 | 5.8 |
| 5 | 4.6 |
| 10 | 4.06 |
| 15 | 4.67 |
| 30 | 2.55 |
| 45 | 1.48 |
| 60 | 1.34 |
| 75 | 1.0 |
| 90 | 1.0 |

Figure 14A:
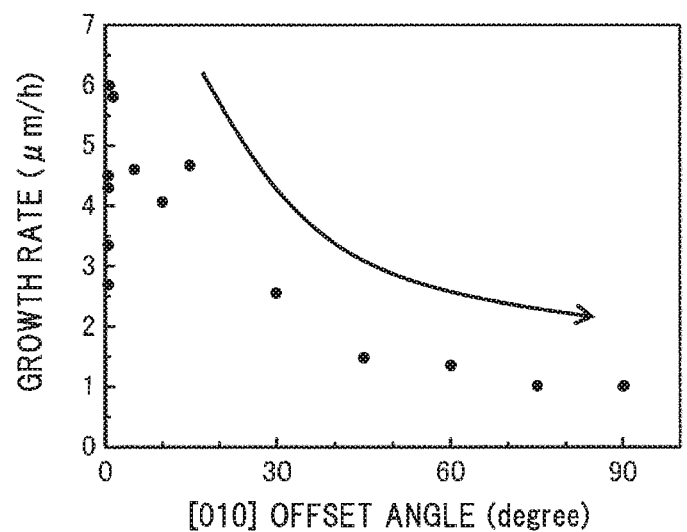
FIG. 14A is a graph plotting data showing a relation between the angle θ and the growth rate of the epitaxial layer shown in Table 4.
Figure 14B:
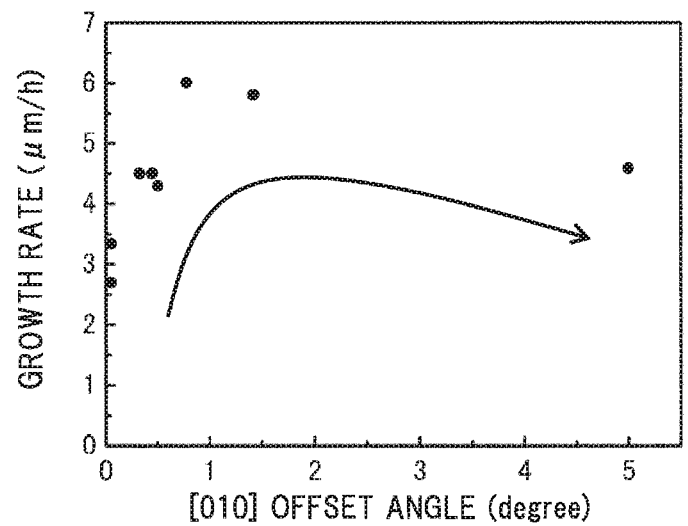
FIG. 14B is an enlarged graph showing the range of 0°≤θ≤5.5° in FIG. 14A.

FIG. 14A is a graph plotting data showing a relation between the angle θ and the growth rate of the epitaxial layer 13 shown in Table 4. FIG. 14B is an enlarged graph showing the range of 0°≤θ≤5.5° in FIG. 14A.

As shown in FIGS. 14A and 14B, the growth rate of the epitaxial layer 13 is relatively high (not less than 2.5 μm/h) with the angle θ of not less than 0° and not more than 30°, and is particularly high (not less than 4.0 μm/h) with the angle θ of not less than 0.3° and not more than 15°. Due to the symmetry of the β-Ga$_2$O$_3$-based single crystal constituting the semiconductor substrate 11, the relation between the growth rate of the epitaxial layer 13 and the absolute value of the negative angle θ is the same as the relation between the growth rate of the epitaxial layer 13 and the absolute value of the positive angle θ. For this reason, it can be said that the growth rate of the epitaxial layer 13 is relatively high with the angle θ of not less than −30° and not more than 30°, and is particularly high with the angle θ of not less than 0.3° and not more than 15°, or not less than −15° and not more than −0.3°.

For the relation between the angle θ and the growth rate of the epitaxial layer 13, similar results are obtained also when the semiconductor substrate 11 and the epitaxial layer 13 are respectively formed of β-Ga$_2$O$_3$-based single crystals other than the β-Ga$_2$O$_3$ single crystal.

Second Embodiment

The second embodiment is an embodiment of a semiconductor element including the epitaxial wafer 10 in the first embodiment. A lateral transistor having a MESFET (Metal Semiconductor Field Effect Transistor) structure will be described below as an example of such a semiconductor element.

Configuration of Semiconductor Element

Figure 15:
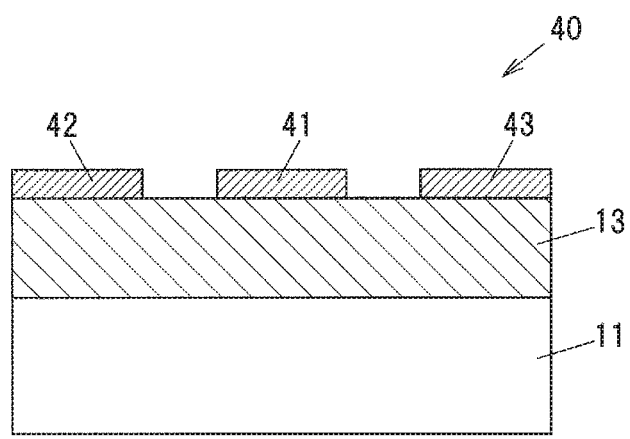
FIG. 15 is a vertical cross-sectional view showing a lateral transistor in the second embodiment.

FIG. 15 is a vertical cross-sectional view showing a lateral transistor 40 in the second embodiment. The lateral transistor 40 includes the epitaxial layer 13 formed on the semiconductor substrate 11, and a gate electrode 41, a source electrode 42 and a drain electrode 43 which are provided on the epitaxial layer 13. The gate electrode 41 is arranged between the source electrode 42 and the drain electrode 43.

The source electrode 42 and the drain electrode 43 are in contact with an upper surface of the epitaxial layer 13 (a surface opposite to the surface in contact with the semiconductor substrate 11) and form ohmic junctions. Meanwhile, the gate electrode 41 is in contact with the upper surface of the epitaxial layer 13 and forms a Schottky junction, and a depletion layer is thereby formed in the epitaxial layer 13 under the gate electrode 41. The lateral transistor 40 functions as either a normally-off transistor or a normally-on transistor depending on the thickness of this depletion region.

The semiconductor substrate 11 is formed of a β-Ga$_2$O$_3$-based crystal containing a p-type dopant such as Mg, Be, Zn or Fe, and has high electrical resistance.

The epitaxial layer 13 contains an n-type dopant such as Si or Sn. The n-type dopant concentration is higher around the contact portion with the source electrode 42 and the drain electrode 43 than in other portions. The thickness of the epitaxial layer 13 is, e.g., 0.1 to 1 μm.

The gate electrode 41, the source electrode 42 and the drain electrode 43 are formed of, e.g., a metal such as Au, Al, Ti, Sn, Ge, In, Ni, Co, Pt, W, Mo, Cr, Cu and Pb, an alloy containing two or more of such metals, a conductive compound such as ITO, or a conductive polymer. The conductive polymer to be used is, e.g., a polythiophene derivative (PEDOT: poly(3,4)-ethylenedioxythiophene) doped with polystyrene sulfonate (PSS) or a polypyrrole derivative doped with TCNA, etc. In addition, the gate electrode 41 may have a two-layer structure composed of two different metals, e.g., Al/Ti, Au/Ni or Au/Co.

In the lateral transistor 40, the thickness of the depletion layer in the epitaxial layer 13 under the gate electrode 41 is changed by controlling bias voltage applied to the gate electrode 41, thereby controlling a drain current.

The lateral transistor 40 described above is an example of the semiconductor element including the epitaxial wafer 10 in the first embodiment, and the epitaxial wafer 10 can be used to manufacture various other semiconductor elements.

It is possible to manufacture, e.g., MISFET (Metal Insulator Semiconductor Field Effect Transistor) and HEMT (High Electron Mobility Transistor) in which the epitaxial layer 13 is used as a channel layer, and Schottky diode in which the semiconductor substrate 11 and the epitaxial layer 13 are respectively connected to an ohmic electrode and a Schottky electrode. Type and concentration of dopants contained in the semiconductor substrate 11 and the epitaxial layer 13 are appropriately determined according to the type of semiconductor element to be manufactured.

A region of the epitaxial layer 13 without any V-shaped grooves and a crystal layer formed on such region are used to manufacture semiconductor elements including the lateral transistor 40. That is, the better the surface morphology of the epitaxial layer 13, the more the semiconductor elements obtained from one wafer.

Effects of the Embodiments

In the embodiment described above, the growth rate of the epitaxial layer 13 formed by the HVPE method can be further increased by adjusting the angle θ of the semiconductor substrate 11 to not less than 0° and not more than 30°, more preferably not less than 0.3° and not more than 15°. As a result, it is possible to efficiently form the epitaxial layer 13. In addition, by growing the epitaxial layer 13 at a high growth rate, it is possible to reduce diffusion of impurities from the semiconductor substrate 11 and thus possible to increase quality.

In addition, surface morphology of the epitaxial layer 13 formed by the HVPE method can be further improved by adjusting the angle θ of the semiconductor substrate 11 to not less than 30° and not more than 90°. This increases an area of the epitaxial layer 13 which can be used to form semiconductor elements and it is thus possible to improve the production yield of the semiconductor element.

Although the embodiments of the invention have been described, the invention is not intended to be limited to the embodiments, and the various kinds of modifications can be implemented without departing from the gist of the invention.

In addition, the invention according to claims is not to be limited to the embodiments described above. Further, it should be noted that all combinations of the features described in the embodiments are not necessary to solve the problem of the invention.

INDUSTRIAL APPLICABILITY

Provided are a semiconductor substrate comprising a β-$Ga_2O_3$-based single crystal on which an epitaxial layer comprising a β-$Ga_2O_3$-based single crystal can be grown by the HVPE method at a high growth rate or on which an epitaxial layer comprising a β-$Ga_2O_3$-based single crystal having good surface morphology can be grown; an epitaxial wafer having the semiconductor substrate and an epitaxial layer; and a method for producing the epitaxial wafer.

REFERENCE SIGNS LIST

10 EPITAXIAL WAFER
11 SEMICONDUCTOR SUBSTRATE
12 PRINCIPAL PLANE
13 EPITAXIAL LAYER

The invention claimed is:

1. A semiconductor substrate that is used as an underlying substrate for epitaxial crystal growth carried out by the HVPE (Halide Vapor Phase Epitaxy) method, the semiconductor substrate comprising:
   a β-$Ga_2O_3$-based single crystal; and
   a principal plane that is a plane parallel to a [100] axis of the β-$Ga_2O_3$-based single crystal,
   wherein the semiconductor substrate has an average dislocation density of not more than $1 \times 10^4 /cm^2$, and an angle θ formed between the principal plane and a (001) plane of the β-$Ga_2O_3$-based single crystal is not less than 54.3° and not more than 65.7°, or not less than −125.7° and not more than −114.3°, where an angle generated by rotation in a rotation direction of a right-handed screw advancing in the a-axis direction is defined as a positive angle.

2. A semiconductor substrate that is used as an underlying substrate for epitaxial crystal growth carried out by the HVPE (Halide Vapor Phase Epitaxy) method, the semiconductor substrate comprising:
   a β-$Ga_2O_3$-based single crystal; and
   a principal plane that is a plane parallel to a [100] axis of the β-$Ga_2O_3$-based single crystal,
   wherein the semiconductor substrate has an average dislocation density of not more than $1 \times 10^3 /cm^2$, and an angle θ formed between the principal plane and a (001) plane of the β-$Ga_2O_3$-based single crystal is not less than 41.6° and not more than 78.4°, or not less than −138.4° and not more than −101.6°, where an angle generated by rotation in a rotation direction of a right-handed screw advancing in the a-axis direction is defined as a positive angle.

3. A semiconductor substrate that is used as an underlying substrate for epitaxial crystal growth carried out by the HVPE (Halide Vapor Phase Epitaxy) method, the semiconductor substrate comprising:
   a β-$Ga_2O_3$-based single crystal; and
   a principal plane that is a plane parallel to a [100] axis of the β-$Ga_2O_3$-based single crystal,
   wherein an angle θ formed between the principal plane and the (001) plane of the β-$Ga_2O_3$-based single crystal is less than −45° and not less than −90°, where an angle generated by rotation in a rotation direction of a right-handed screw advancing in the a-axis direction is defined as a positive angle.

4. A semiconductor substrate that is used as an underlying substrate for epitaxial crystal growth carried out by the HVPE (Halide Vapor Phase Epitaxy) method, the semiconductor substrate comprising:
   a β-$Ga_2O_3$-based single crystal; and
   a principal plane that is a plane parallel to a [100] axis of the β-$Ga_2O_3$-based single crystal,
   wherein an angle θ formed between the principal plane and the (001) plane of the β-$Ga_2O_3$-based single crystal is not less than 0.3° and not more than 15°, or not less than −15° and not more than −0.3°, where an angle generated in a rotation direction of a right-handed screw advancing in the a-axis direction is defined as a positive angle.

5. An epitaxial wafer, comprising:
the semiconductor substrate according to claim 1, 2, 3 or 4; and
an epitaxial layer comprising a β-$Ga_2O_3$-based single crystal and formed on the principal plane of the semiconductor substrate by epitaxial crystal growth using the HVPE (Halide Vapor Phase Epitaxy) method.

6. A method for producing an epitaxial wafer, comprising:
by using the HVPE (Halide Vapor Phase Epitaxy) method, epitaxially growing an epitaxial layer comprising a β-$Ga_2O_3$-based single crystal on a semiconductor substrate that comprises a β-$Ga_2O_3$-based single crystal and has a principal plane parallel to a [100] axis of the β-$Ga_2O_3$-based single crystal,
wherein the semiconductor substrate has an average dislocation density of not more than $1\times10^4/cm^2$, and an angle θ formed between the principal plane and a (001) plane of the β-$Ga_2O_3$-based single crystal is not less than 54.3° and not more than 65.7°, or not less than −125.7° and not more than −114.3°, where an angle generated by rotation in a rotation direction of a right-handed screw advancing in the a-axis direction is defined as a positive angle.

7. A method for producing an epitaxial wafer, comprising:
by using the HVPE (Halide Vapor Phase Epitaxy) method, epitaxially growing an epitaxial layer comprising a β-$Ga_2O_3$-based single crystal on a semiconductor substrate that comprises a β-$Ga_2O_3$-based single crystal and has a principal plane parallel to a [100] axis of the β-$Ga_2O_3$-based single crystal,
wherein the semiconductor substrate has an average dislocation density of not more than $1\times10^3/cm^2$, and an angle θ formed between the principal plane and a (001) plane of the β-$Ga_2O_3$-based single crystal is not less than 41.6° and not more than 78.4°, or not less than −138.4° and not more than −101.6°, where an angle generated by rotation in a rotation direction of a right-handed screw advancing in the a-axis direction is defined as a positive angle.

8. A method for producing an epitaxial wafer, comprising:
by using the HVPE (Halide Vapor Phase Epitaxy) method, epitaxially growing an epitaxial layer comprising a β-$Ga_2O_3$-based single crystal on a semiconductor substrate that comprises a β-$Ga_2O_3$-based single crystal and has a principal plane parallel to a [100] axis of the β-$Ga_2O_3$-based single crystal,
wherein an angle θ formed between the principal plane and the (001) plane of the β-$Ga_2O_3$-based single crystal is less than −45° and not less than −90°, where an angle generated by rotation in a rotation direction of a right-handed screw advancing in the a-axis direction is defined as a positive angle.

9. A method for producing an epitaxial wafer, comprising:
by using the HVPE (Halide Vapor Phase Epitaxy) method, epitaxially growing an epitaxial layer comprising a β-$Ga_2O_3$-based single crystal on a semiconductor substrate that comprises a β-$Ga_2O_3$-based single crystal and has a principal plane parallel to a [100] axis of the β-$Ga_2O_3$-based single crystal,
wherein the growth rate of the epitaxial layer is not less than 2.5 μm/h, and
wherein an angle θ formed between the principal plane and the (001) plane of the β-$Ga_2O_3$-based single crystal is not less than 0.3° and not more than 15°, or not less than −15° and not more than −0.3°, where an angle generated by rotation in a rotation direction of a right-handed screw advancing in the a-axis direction is defined as a positive angle.

* * * * *